United States Patent
Hastings et al.

(10) Patent No.: US 7,417,234 B2
(45) Date of Patent: Aug. 26, 2008

(54) SPATIAL-PHASE LOCKING OF ENERGY BEAMS FOR DETERMINING TWO-DIMENSIONAL LOCATION AND BEAM SHAPE

(75) Inventors: Jeffrey T. Hastings, Lexington, KY (US); James G. Goodberlet, Melrose, MA (US); Feng Zhang, Cambridge, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 273 days.

(21) Appl. No.: 11/130,892

(22) Filed: May 17, 2005

(65) Prior Publication Data

US 2005/0269524 A1 Dec. 8, 2005

Related U.S. Application Data

(60) Provisional application No. 60/571,726, filed on May 17, 2004.

(51) Int. Cl.
*H01J 37/304* (2006.01)
(52) U.S. Cl. ............... 250/397; 250/396 R; 250/491.1; 250/492.2; 250/492.23; 250/492.21
(58) Field of Classification Search ............ 250/442.11, 250/440.11, 283, 491.1–492.3, 361 R, 396 R, 250/397
See application file for complete search history.

(56) References Cited

U.S. PATENT DOCUMENTS

| | | | |
|---|---|---|---|
| 5,136,169 A | 8/1992 | Smith et al. | |
| 5,345,085 A | 9/1994 | Prior | |
| 5,434,422 A | 7/1995 | Iwamoto et al. | |
| 5,703,373 A | 12/1997 | Peckerar et al. | |

(Continued)

OTHER PUBLICATIONS

"Digital Electrostatic Electron-Beam Array Lithography," Baylor et al., *J. Vac. Sci. Technol.* B 20(6), (Nov./Dec. 2002).

(Continued)

*Primary Examiner*—Jack I. Berman
*Assistant Examiner*—Michael J Logie
(74) *Attorney, Agent, or Firm*—Gauthier & Connors LLP

(57) ABSTRACT

A method or system of spatial-phase locking a beam used in maskless lithography provides a fiducial grid with a single spatial-period, the fiducial grid being rotated at an angle with respect to a direction of scanning the beam; detects a signal generated in response to the beam being incident upon the fiducial grid; determines frequency components of the detected signal; and determines a two-dimensional location of the beam from phases of two determined fundamental frequency component. The method or system further determines a size of the beam from relative amplitudes of the determined fundamental and harmonic frequency components and/or determine a shape of the beam from relative amplitudes of the determined fundamental and harmonic frequency components. The method or system corrects a deflection of the beam in response to the determined two-dimensional location, and/or adjusts the size of the beam in response to the determined size, and/or adjusts the shape of the beam in response to the determined shape. If the method or system spatial-phase locks a plurality of beams used in maskless lithography, a fiducial grid with a varying spatial-period is utilized. In the plural beam method or system, the frequency components for each beam are determined using frequency-division multiplexing.

67 Claims, 3 Drawing Sheets

U.S. PATENT DOCUMENTS

| | | | |
|---|---|---|---|
| 5,747,802 A | | 5/1998 | Arnold et al. |
| 5,892,230 A | * | 4/1999 | Goodberlet et al. ..... 250/361 R |
| 5,962,863 A | | 10/1999 | Russell et al. |
| 6,392,242 B1 | | 5/2002 | Perkins et al. |
| 6,437,348 B1 | | 8/2002 | Spence |
| 6,606,149 B1 | | 8/2003 | Ogasawara et al. |
| 6,781,680 B1 | | 8/2004 | Ogasawara et al. |
| 6,822,248 B2 | * | 11/2004 | Ferrera et al. .......... 250/492.22 |
| 6,836,319 B2 | * | 12/2004 | Ogasawara et al. ......... 356/121 |
| 6,870,172 B1 | | 3/2005 | Mankos et al. |
| 6,882,477 B1 | * | 4/2005 | Schattenburg et al. ....... 359/577 |
| 2002/0130274 A1 | * | 9/2002 | Ferrera et al. ............ 250/492.1 |

OTHER PUBLICATIONS

"Initial Lithography Results From the Digital Electrostatic e-beam Array Lithography Concept," Baylor et al., *J. Vac. Sci. Technol.* B 22(6), (Nov./Dec. 2004).

"Prototype Raster Multibeam Lithography Tool," Coyle et al., *J. Vac. Sci. Technol.*, B 20(6), (Nov./Dec. 2002).

"Progress Toward a Raster Multibeam Lithography Tool," Coyle et al., *J. Vac. Sci. Technol.*, B 22(2), (Mar./Apr. 2004).

"Extending Spatial-Phase-Locked Electron Beam Lithography to Two Dimensions," Goodberlet et al., *J. Appl. Phys*. vol. 36, pp. 7557-7559 (1997).

"Distributed, Multiple Variable Shaped Electron Beam Column for High Throughput Maskless Lithography," Groves et al., *J. Vac. Sci. Technol*. B16(6) (Nov./Dec. 1998).

"Nanometer-Level Stitching in Raster-Scanning Electron-Beam Lithography Using Spatial-Phase Locking," Hastings et al., *J. Vac. Sci. Technol*. B 21(6), (Nov./Dec. 2003).

"Distributed Axis Electron-Beam System for Lithography and Inspection—Preliminary Experimental Results," Pickard et al., *J. Vac. Sci. Technol*. B 20(6), (Nov./Dec. 2002).

"Distributed Axis Electron Beam Technology for Maskless Lithography and Defect Inspection," Pickard et al., *J. Vac. Sci. Technol*. B 21(6), (Nov./Dec. 2003).

"Recent Progress in lXx-ray Mask Technology: Feasibility Study Using ASET-NIST Format TaXN x-ray Masks with 100 nm Rule 4 Gbit Dynamic Random Access Memory Test Patterns," Tsuboi et al., *J. Vac. Sci. Technol*. B 19(6), (Nov./Dec. 2001).

Smith et al., "A new approach to high fidelity *e*-beam and ion-beam lithography based on an *in situ* global-fiducial grid" Journal of Vacuum Science and Technology, Nov./Dec. 1991, No. 6, pp. 2992-2995.

Smith et al., "Application of moiré techniques in scanning-electron-beam lithography and microscopy" Journal of Vacuum Science & Technology, vol. 17 No. 6, 1999, pp. 1262-1265.

Schattenburg et al., "Sub-100 nm metrology using interferometrically produced fiducials" Journal of Vacuum Science & Technology, Nov./Dec. 1999, pp. 2692-2697.

\* cited by examiner

SPATIAL-PHASE LOCKING OF ENERGY BEAMS FOR DETERMINING TWO-DIMENSIONAL LOCATION AND BEAM SHAPE

PRIORITY INFORMATION

The present patent application claims priority under 35 U.S.C. §119 from U.S. Provisional Patent Application Ser. No. 60/571,726, filed on May 17, 2004. The entire contents of U.S. Provisional Patent Application Ser. No. 60/571,726, filed on May 17, 2004 are hereby incorporated by reference.

GOVERNMENT RIGHTS NOTICE

The present invention was made with government support under Grant (Contract) Number, DAAD19-99-1-0280, awarded by the US Defense Advanced Research Projects Agency through the US Army Research Office. The US Government has certain rights to this invention.

FIELD OF THE PRESENT INVENTION

The present invention is directed to maskless lithography systems based on a scanning energy or particle beam. More particularly, the present invention is directed to methods and systems that correct placement, size, and/or shape of one or many beams involved in the lithography process.

BACKGROUND OF THE PRESENT INVENTION

Scanning-electron beam lithography uses an electron beam to write patterns, e.g. mask patterns, in electron sensitive films on substrates. An electron beam can be focused to a diameter of less than 10 nm, allowing patterns of extremely fine dimensions to be written.

For maskless lithography, electron beams would appear to offer the ideal solution, if only two problems could be solved: slow speed and poor pattern-placement accuracy.

When an electron beam is focused to a fine spot, patterns are written in a pixel-by-pixel manner. This pixel-by-pixel addressing is slow for an electron beam system. To address this problem, it has been proposed to project several pixels in parallel, i.e., the shaped beam approach.

Conventional methods using shaped-beam electron projection suffer from three shortcomings. First, the current density has to be reduced by orders-of-magnitude relative to the current density in a "round-beam" system in order to limit the effects of mutual electrostatic repulsion. Thus, if 1000 pixels are projected in parallel, the throughput does not go up by a factor of 1000 but rather only by a factor of 10 or less.

Second, pattern-placement accuracy and pattern distortion become very serious limitations in shaped-beam systems. To address this issue, "product-specific emulation" schemes are conventionally employed, but these are not stable in time. The end result is that shaped beam systems have to operate at very high voltages and are highly expensive.

Third, the shaped-beam approach assumes that the patterns consist of elements containing hundreds or thousands of pixels. However, this is not always the case. Conventionally, the most demanding patterns are generally composed of dense features at minimum linewidths (e.g., DRAM patterns). In this case the utility of the shaped-beam approach is highly limited.

As noted above, pattern-placement inaccuracy is a persistent problem in energy-beam lithography techniques such as scanning-electron-beam lithography. Pattern-placement errors stem from a variety of environmental and system variations; however, the fundamental issue is the open-loop nature of these systems, i.e. the beam location on the substrate is not monitored during exposure.

However, the energy-beam locating method described in U.S. Pat. No. 5,136,169 can be used to provide closed-loop control of the beam position by monitoring the signal from a fiducial grid on the substrate. The entire content of U.S. Pat. No. 5,136,169 is hereby incorporated by reference.

One conventional solution for determining the location of an energy beam in two dimensions that utilizes a fiducial grid on the substrate requires that the fiducial grid have two different spatial-periods. This conventional approach sacrifices performance because one period is necessarily coarser than the other.

One conventional solution for determining the location of an energy beam in two dimensions that utilizes a fiducial grid on the substrate requires a fiducial grid with two different signal carriers (e.g. two different optical emission wavelengths). This second conventional approach adds undesirable complexity to the system and to the grid itself.

Therefore, it is desirable to provide a scanning-electron beam lithography that avoids pattern-placement inaccuracy. Moreover, it is desirable to provide a scanning-electron beam lithography which is capable of determining energy beam location in two-dimensions.

Furthermore, it is desirable to provide a scanning-electron beam lithography that is quicker than conventional systems. It is also desirable to provide a scanning-electron beam lithography that utilizes multiple parallel energy beams. Lastly, it is desirable to provide a scanning-electron beam lithography that determines the location of several parallel energy beams and the beams' shape.

SUMMARY OF THE PRESENT INVENTION

One aspect of the present invention is a method of spatial-phase locking a beam used in maskless lithography. The method provides a fiducial grid with a single spatial-period, the fiducial grid being rotated at an angle with respect to a direction of scanning a beam; detects a signal generated in response to the beam being incident upon the fiducial grid; determines frequency components of the detected signal; and determines a two-dimensional location of the beam from phases of two determined fundamental frequency component.

Another aspect of the present invention is a method of spatial-phase locking a plurality of beams used in maskless lithography. The method provides a fiducial grid with a varying spatial-period; detects a signal generated in response to each beam being incident upon the fiducial grid, the signal for each beam being modulated at a different frequency; determines frequency components for each beam from the detected signals; and determines a two-dimensional location of each beam from associated phases of two determined fundamental frequency component.

A third aspect of the present invention is a maskless lithography system. The maskless lithography system includes a substrate to be processed, the substrate including a fiducial grid with a single spatial-period, the fiducial grid being rotated at an angle with respect to a direction of scanning a beam; a beam source to generate a beam to scan the substrate; a deflection system to two-dimensionally deflect a position of the beam with respect to the substrate; a detector to detect a signal generated in response to the beam being incident upon the fiducial grid; and a processor to determine frequency components of the detected signal and determine a two-dimensional location of the beam from phases of two determined fundamental frequency component.

A fourth aspect of the present invention is a maskless lithography system. The maskless lithography system includes a substrate to be processed, the substrate including a fiducial grid with a varying spatial-period; a beam source to generate a plurality of beams to scan the substrate; a deflection system to independently two-dimensionally deflect a position of each beam with respect to the substrate; a detector to detect a signal generated in response to each beam being incident upon the fiducial grid; and a processor to determine frequency components for each beam from the detected signal and determine a two-dimensional location of each beam from associated phases of two determined fundamental frequency component.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
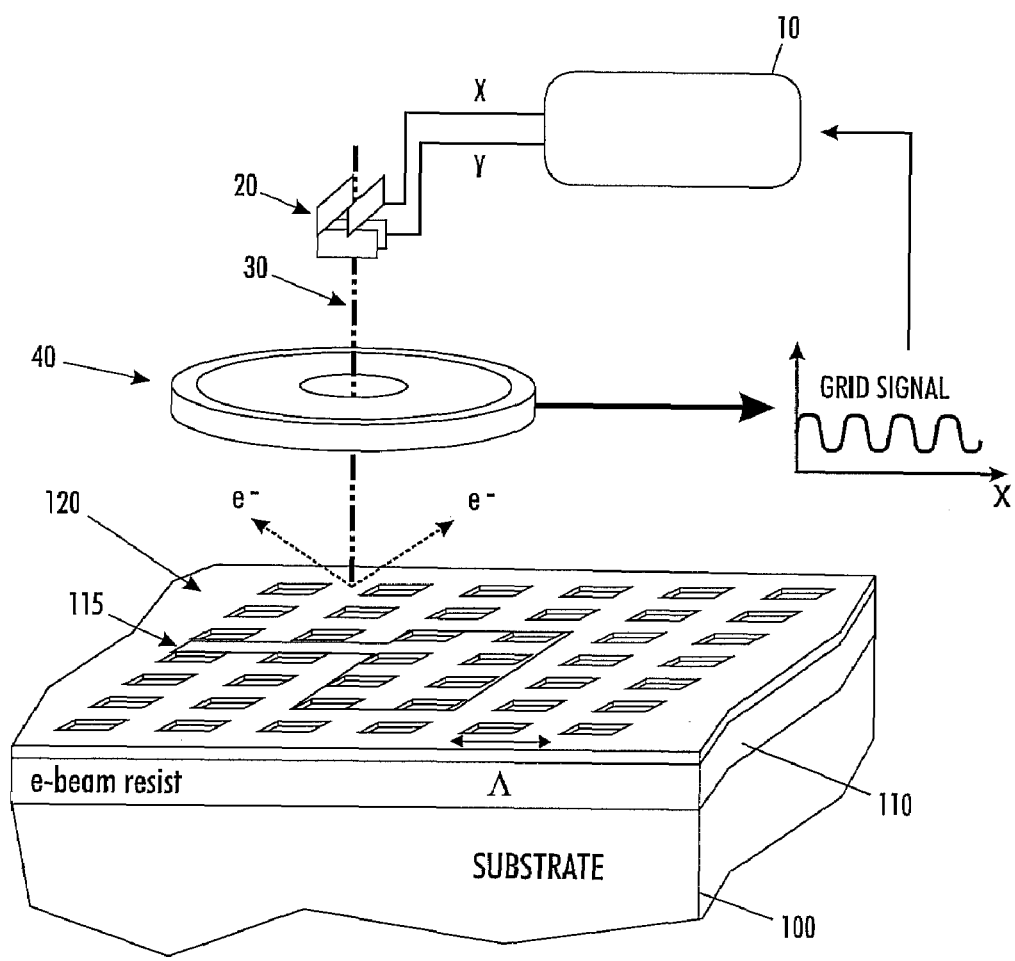
FIG. 1 shows a block diagram of a system for closed loop e-beam lithography according to the concepts of the present invention.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

As noted above, pattern-placement inaccuracy is coupled to the cost of e-beam lithography and hence to the feasibility of maskless lithographs. For example, to overcome the limitation of open-loop operation, e-beam systems become highly complex and expensive making the slow speed of writing unacceptable economically. In addition, an open-loop approach to ensuring the placement accuracy of every beam in multi-beam systems is a formidable task.

Pattern-placement errors arise from a variety of sources. For example, stray electric and magnetic fields, mechanical vibrations, deflection non-linearities, temperature variations, electrical charging of substrates and system components, and stage positioning errors all contribute to inaccurate beam positioning on the substrate. These factors may contribute to patterning errors—which change on time scales ranging from milliseconds to days. Errors appearing at the boundaries between adjacent deflection fields are particularly troublesome and are referred to as stitching errors.

The difficulty of accurate pattern-placement is compounded in multi-beam lithography systems. In addition to the standard environmental and system issues, one must be concerned about spatial variations in temperature, charging, stray fields, etc. that influence each beam differently. In addition, the deflection system for each beam must be calibrated individually, increasing the impact of calibration errors. Finally cross-talk between beam deflection systems introduces a new source of patterning error.

An approach to resolving these problems is illustrated in FIG. 1. FIG. 1 shows closed loop e-beam lithography, called spatial-phase-locked e-beam lithography. Spatial-phase-locked e-beam lithography provides feedback control of the e-beam position by monitoring the signal from a non-perturbative fiducial grid located on the substrate. Patterning the grid with interference lithography or scanning-beam interference lithography provides long-range spatial-phase coherence.

As illustrated in FIG. 1, when a substrate 100 having an e-beam resist 110 formed thereon with an exposed pattern 115 therein and a non-perturbative fiducial grid 120 formed over the e-beam resist 110 is struck by a primary electron beam 30, the grid 120 produces a signal, consisting of either backscattered-electrons, secondary-electrons, photons, or a combination thereof. By detecting the phase of this periodic signal with a secondary electron detector 40, the beam-placement error to a small fraction of the grid period can be readily determined or estimated. A signal processor 10, as illustrated in FIG. 1, provides feedback control for the x-beam and y-beam deflection system 20 by phase-locking to the secondary electron signal from an electron-transparent fiducial grid 120 covering the entire substrate 100.

In the system described above, a preferred fiducial grid 120 may reduce or eliminate any perturbing of the e-beam lithography. The fiducial grid 120 may provide sufficient signal-to-noise to enable the spatial-phase-locked e-beam lithography feedback loop to operate at high speed. Also, the fiducial grid 120 may be patterned on top of the e-beam resist by a process that is simple, clean, low cost, and compatible with other aspects of processing. Lastly, the fiducial grid 120 may be made with absolute accuracy, freedom from distortion to the sub-1nm level, and covers the entire area of the substrate 100.

It is further noted that the fiducial grid 120 may be only 1 to a few nanometers thick because the electrons used in lithography have energies of 20 to 100 keV, and ranges of several microns in solids, thus a 3-nm thick grid would have no detrimental effect on the lithography.

As noted above, when passing through the fiducial grid 120, an incident electron will create secondary electrons, which can be used as the signal for the spatial-phase-locked e-beam lithography feedback system. The thickness of the fiducial grid 120 should be about equal to the diffusion length of secondary electrons, which in metals is also 1 to a few nanometers.

It is noted that the fiducial grid 120 may be constructed of aluminum grids. It is further noted that the fiducial grid 120 may be constructed of buckyballs and carbon nanotubes (so-called fullerenes) because these materials emit secondary electrons copiously.

It is noted that the beam used for scanning may be an electron beam; a particle beam; and/or a photon beam Also, the detected signal may be secondary electrons generated in response to the beam being incident upon the fiducial grid; secondary ions generated in response to the beam being incident upon the fiducial grid; fluorescence light generated in response to the beam being incident upon the fiducial grid; light generated in response to the beam being incident upon the fiducial grid; and/or backscattered electrons generated in response to the beam being incident upon the fiducial grid.

As noted above, to overcome the traditional problem of slow speed in e-beam lithography, the present invention utilizes a lithography system that exposes patterns using many parallel beams. Such a system is illustrated in FIG. 2.

Figure 2:
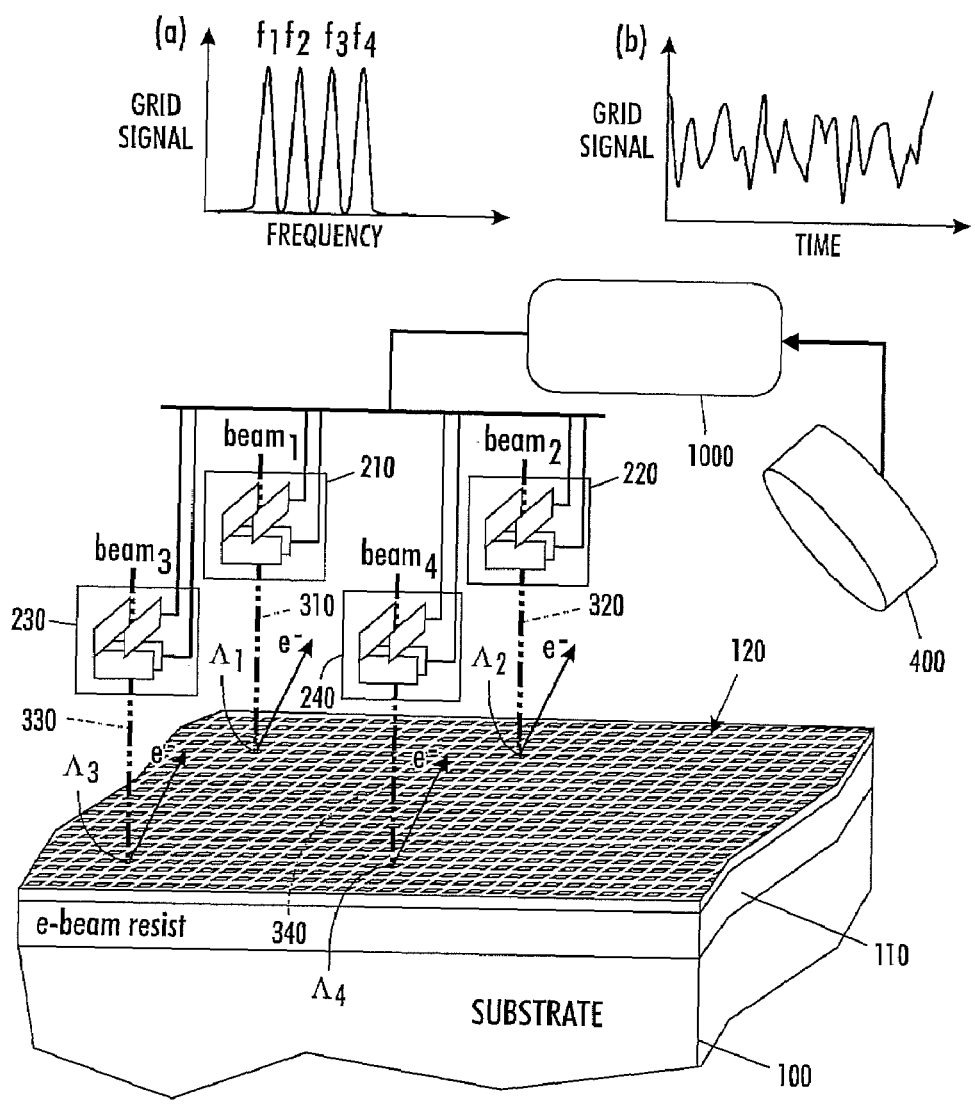
FIG. 2 shows a block diagram of a system for multiple parallel e-beam closed loop lithography according to the concepts of the present invention.

As illustrated in FIG. 2, when a substrate 100 having an e-beam resist 110 formed thereon and a non-perturbative fiducial grid 120 formed over the e-beam resist 110 is struck by a plurality of primary electron beams 310-340, the grid 120 produces a plurality of signals, each consisting of either backscattered-electrons, secondary-electrons, photons, or a combination thereof. By detecting the phase of each of these periodic signals with a secondary electron detector 400, the beam-placement error to a small fraction of the grid period can be readily determined or estimated. A signal processor 10, as illustrated in FIG. 2, provides feedback control for the x-beam and y-beam deflection systems 210-240 by phase-locking to the secondary electron signal from an electron-transparent fiducial grid 120 covering the entire substrate 100.

In the system illustrated in FIG. 2, the spatial-phase locking for multi-beam systems uses frequency-division-multiplexing. Each electron beam (310-340) scans over an electron-transparent fiducial grid 120 that produces the various secondary-electron signals. The grid period ($\Lambda_1$-$\Lambda_4$) varies across the substrate 100 such that the secondary-electron signal for each beam is modulated at a different frequency. The signals are all acquired by the same detector 400; as a result, the signals are combined in the time domain (b).

To perform spatial-phase locking, the signals are separated in the frequency domain (a), and phase detection is performed at each frequency. The beam-placement errors are calculated, and a correction signal is fed back to the each set of beam deflection systems 210-240. Thus, the grid period $\Lambda_1$ yields a signal with frequency f1 to provide feed-back control of beam 1, and likewise for the other beams.

It is noted that by using a fiducial grid whose spatial-period varies across the substrate, the position of each beam can be encoded in a separate temporal-frequency within the secondary electron signal. For example, the first beam might scan over a region where the grid period is 200 nm and the second beam would scan a region where the period is 204 nm. Even though the same detector acquires the signal from both areas, the temporal frequencies generated by each beam would differ by 2%. The two signals could be separated electronically and their individual phases interpreted. Thus, the system can provide closed-loop control for each beam by phase-locking at several different frequencies.

In addition, the use of frequency-division-multiplexing improves system throughput by allowing simultaneous deflection calibration of all beams and by eliminating frequent drift corrections during an exposure.

It is noted that the realization of two frequencies per beam provides enough information to the location of the e-beams in two-dimensions. If the determination of the shape of the beam is also desired, the system needs to realize four frequencies per beam.

It is noted that the beams used for scanning may be electron beams; particle beams; and/or; photon beams. Also, the detected signal may be secondary electrons generated in response to the beams being incident upon the fiducial grid; secondary ions generated in response to the beams being incident upon the fiducial grid; fluorescence light generated in response to the beams being incident upon the fiducial grid; light generated in response to the beams being incident upon the fiducial grid; and/or backscattered electrons generated in response to the beams being incident upon the fiducial grid.

In maskless lithography systems that require multi-level patterning with precise alignment, the spatial-phase locking of the present invention allows the patterns on each level to be referenced to a standard fiducial grid; as a result, both pattern-placement and overlay can be maintained throughout the fabrication process. In this example, the fiducial grid for each level of lithography is registered to the previous levels and any residual registration error is detected and corrected.

Figure 3:
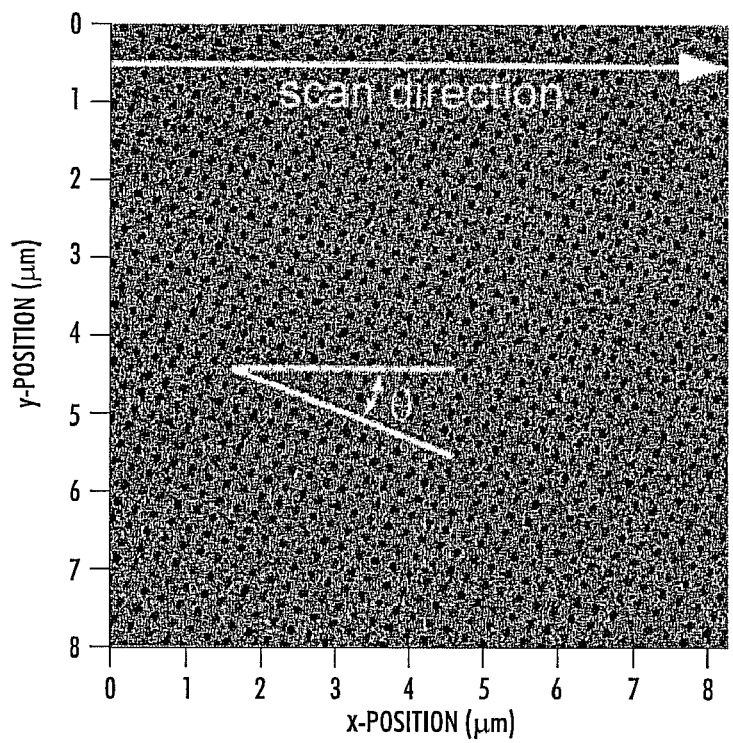
FIG. 3 shows locating the e-beam by scanning the beam at an angle other than 0° or 45° according to the concepts of the present invention.

In a further embodiment of the present invention, the locating of the beam uses a grid with a single spatial-period and a single signal carrier; however, in this embodiment, the grid is rotated at an angle with respect to the direction of the beam's motion. As shown in FIG. 3, scanning the beam at an angle other than 0° or 45° with respect to the grid produces two distinct frequency components. The preferred angle of rotation depends on the grid and the energy-beam delivery system, but many choices of rotation angle provide adequate performance.

It is noted that the angle is not 90° or 0° because these directions would lack any information to enable the determination of the location of the e-beam(s) in two-dimensions. Moreover, an angle of 45° produces only a single frequency, and thus, there is not enough information to enable the determination of the location of the e-beam(s) in two-dimensions. It is preferred to use an angle wherein the harmonics of the lower frequency do not overlap the higher frequency or its harmonic frequencies. In addition, it is preferred to use and angle that produces sum or difference frequencies that do not interfere with the fundamental or harmonic frequencies.

Figure 4:
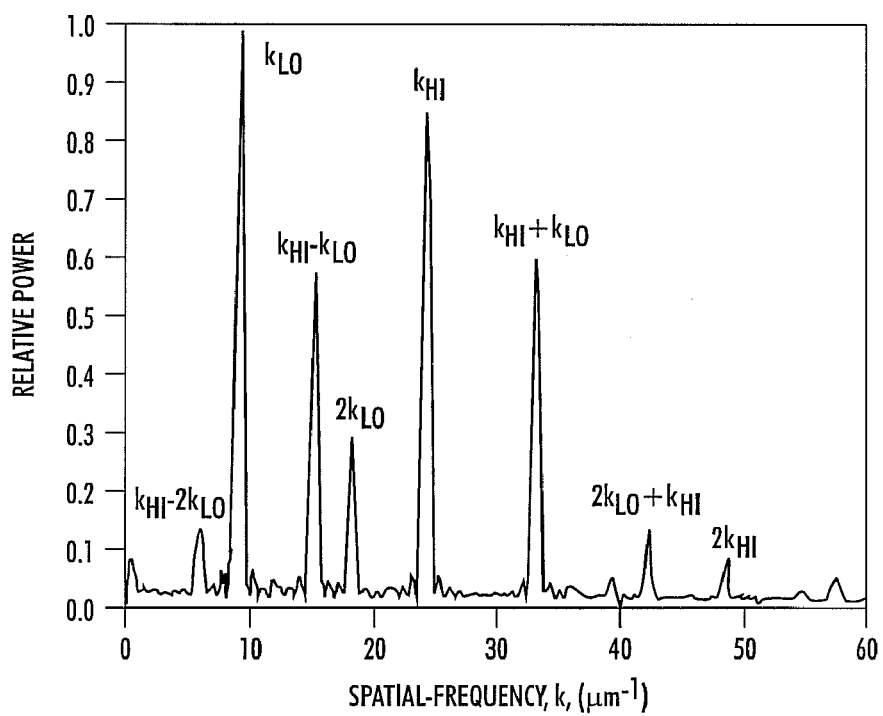
FIG. 4 illustrates an example of a spatial-frequency spectrum of the signal acquired from scanning the grid at an angle according to the concepts of the present invention.

To locate an energy beam in two-dimensions without using multiple grid periods or signal carriers, as noted above, the beam is scanned at an angle with respect to the grid. An example of a spatial-frequency spectrum of the signal acquired from scanning the grid at an angle is shown in FIG. 4. The phases of the two fundamental frequency component, labeled $k_{LO}$ and $k_{HI}$, can be analyzed to locate the beam in two-dimensions. The additional frequency components shown in FIG. 4 can be used to determine the size and shape of the beam. In addition, the size and shape of the beam can be determined from relative amplitudes of the fundamental and harmonic frequency components.

As discussed above, the additional frequency components can determine the shape of the energy beam based on the signal(s) acquired from the fiducial grid. For example consider a grid that is binary in nature.

For such a grid, there exist additional frequency components, observable in FIG. 4, in the fiducial grid signal. The size and shape of the beam can be determined from the relative amplitudes of these components.

More specifically, a large Gaussian beam produces smaller high-frequency harmonic components than a small Gaussian beam because the convolution of the beam with the grid pattern effectively attenuates higher frequencies. In other words, large beams act as lowpass filters that filter out the high frequency harmonics.

In addition, a beam that is astigmatic, or elongated in one direction, will produce a signal where the various frequencies are altered differently depending on the orientation and extent of the astigmatism.

In summary, a method or system of spatial-phase locking a beam used in maskless lithography provides a fiducial grid with a single spatial-period and a single signal carrier, the fiducial grid rotated at an angle with respect to a direction of scanning a beam; detects a signal generated in response to the beam being incident upon the fiducial grid; determines frequency components of the detected signal; and determines a two-dimensional location of the beam from phases of two determined fundamental frequency component.

The method or system may further determine a size of the beam from relative amplitudes of the determined frequency components and/or determine a shape of the beam from relative amplitudes of the determined frequency components. The method or system may correct a deflection of the beam in response to the determined two-dimensional location, size, and/or shape.

The beam used for scanning may be an electron beam; a particle beam; and/or a photon beam. Also, the detected signal may be secondary electrons generated in response to the beam being incident upon the fiducial grid; secondary ions generated in response to the beam being incident upon the fiducial grid; fluorescence light generated in response to the beam being incident upon the fiducial grid; light generated in response to the beam being incident upon the fiducial grid; and/or backscattered electrons generated in response to the beam being incident upon the fiducial grid.

Moreover, a method or system of spatial-phase locking a plurality of electronic beams used in maskless lithography provides a fiducial grid with a varying spatial-period; detects secondary electrons generated by each electron beam being incident upon the fiducial grid, secondary electrons for each beam being modulated at a different frequency; determines frequency components for each electron beam from the detected secondary electrons; and determines a two-dimensional location of each electron beam from associated phases of two determined fundamental frequency components.

The method or system may further determine a size of the electron beam from relative amplitudes of the determined frequency components and/or determine a shape of the electron beam from the relative amplitudes of the determined frequency components. The method or system may correct a deflection of the electron beam in response to the determined two-dimensional location, size, and/or shape. Also, the method or system may determine the frequency components for each electron beam using frequency-division multiplexing.

The beams used for scanning may be electron beams; particle beams; and/or photon beams. Also, the detected signal may be secondary electrons generated in response to the beams being incident upon the fiducial grid; secondary ions generated in response to the beams being incident upon the fiducial grid; fluorescence light generated in response to the beams being incident upon the fiducial grid; light generated in response to the beams being incident upon the fiducial grid; and/or backscattered electrons generated in response to the beams being incident upon the fiducial grid.

While the present invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of spatial-phase locking a beam used in maskless lithography, comprising:

(a) providing a fiducial grid with a single spatial-period, the fiducial grid being rotated at an angle with respect to a direction of scanning a beam;
   (b) detecting a signal generated in response to the beam being incident upon the fiducial grid;
   (c) determining a plurality of frequency components of the detected signal; and
   (d) determining a two-dimensional location of the beam from phases of two determined frequency components of the detected signal.

2. The method as claimed in claim 1, further comprising:
   (e) determining a size of the beam from relative amplitudes of determined frequency components of the detected signal corresponding to fundamental and harmonic frequency components of the detected signal.

3. The method as claimed in claim 1, further comprising:
   (e) determining a shape of the beam from relative amplitudes of determined frequency components of the detected signal corresponding to fundamental and harmonic frequency components of the detected signal.

4. The method as claimed in claim 1, further comprising:
   (e) determining a size of the beam from relative amplitudes of determined frequency components of the detected signal corresponding to fundamental and harmonic frequency components of the detected signal; and
   (f) determining a shape of the beam from relative amplitudes of determined frequency components of the detected signal corresponding to fundamental and harmonic frequency components of the detected signal.

5. The method as claimed in claim 1, further comprising:
   (e) correcting a deflection of the beam in response to the determined two-dimensional location.

6. The method as claimed in claim 2, further comprising:
   (f) correcting a deflection of the beam in response to the determined two-dimensional location and adjusting the size of the beam in response to the determined size.

7. The method as claimed in claim 3, further comprising:
   (f) correcting a deflection of the beam in response to the determined two-dimensional location and adjusting the shape of the beam in response to the determined shape.

8. The method as claimed in claim 4, further comprising:
   (f) correcting a deflection of the beam in response to the determined two-dimensional location and adjusting the size of the beam in response to the determined size; and, adjusting the shape of the beam in response to the determined shape.

9. The method as claimed in claim 1, wherein the beam is an electron beam.

10. The method as claimed in claim 1, wherein the beam is a particle beam.

11. The method as claimed in claim 1, wherein the beam is a photon beam.

12. The method as claimed in claim 1, wherein the signal is secondary electrons generated in response to the beam being incident upon the fiducial grid.

13. The method as claimed in claim 1, wherein the signal is secondary ions generated in response to the beam being incident upon the fiducial grid.

14. The method as claimed in claim 1, wherein the signal is fluorescence light generated in response to the beam being incident upon the fiducial grid.

15. The method as claimed in claim 1, wherein the signal is light generated in response to the beam being incident upon the fiducial grid.

16. The method as claimed in claim 1, wherein the signal is backscattered electrons generated in response to the beam being incident upon the fiducial grid.

17. A method of spatial-phase locking a plurality of beams used in maskless lithography, comprising:
(a) providing a fiducial grid with a varying spatial-period;
(b) detecting a signal generated in response to each beam being incident upon the fiducial grid, the signal for each beam being modulated at a different frequency;
(c) determining frequency components, for each beam, of the detected signals; and
(d) determining a two-dimensional location, for each beam, from beam associated phases of two determined frequency components of the beam associated detected signal.

18. The method as claimed in claim 17, further comprising:
(e) determining, for each beam, a size of the beam from relative amplitudes of determined frequency components of the detected signal corresponding to fundamental and harmonic frequency components of the detected signal.

19. The method as claimed in claim 17, further comprising:
(e) determining, for each beam, a shape of the beam from relative amplitudes of determined frequency components of the detected signal corresponding to fundamental and harmonic frequency components of the detected signal.

20. The method as claimed in claim 17, further comprising:
(e) determining, for each beam, a size of the beam from relative amplitudes of determined frequency components of the detected signal corresponding to fundamental and harmonic frequency components of the detected signal; and
(f) determining, for each beam, a shape of the beam from relative amplitudes of determined frequency components of the detected signal corresponding to fundamental and harmonic frequency components of the detected signal.

21. The method as claimed in claim 17, further comprising:
(e) correcting, for each beam, a deflection of the beam in response to the determined two-dimensional location.

22. The method as claimed in claim 17, wherein frequency components for each beam are determined using frequency-division multiplexing.

23. The method as claimed in claim 18, further comprising:
(f) correcting, for each beam, a deflection of the beam in response to the determined two-dimensional location and adjusting, for each beam, the size of the beam in response to the determined size.

24. The method as claimed in claim 19, further comprising:
(f) correcting, for each beam, a deflection of the beam in response to the determined two-dimensional location and adjusting, for each beam, the shape of the beam in response to the determined shape.

25. The method as claimed in claim 20, further comprising:
(f) correcting, for each beam, a deflection of the beam in response to the determined two-dimensional location and adjusting, for each beam, the size of the beam in response to the determined size; and, adjusting the shape of the beam in response to the determined shape.

26. The method as claimed in claim 17, wherein the plurality of beams are electron beams.

27. The method as claimed in claim 17, wherein the plurality of beams are particle beams.

28. The method as claimed in claim 17, wherein the plurality of beams are photon beams.

29. The method as claimed in claim 17, wherein the signal is secondary electrons generated in response to the beams being incident upon the fiducial grid.

30. The method as claimed in claim 17, wherein the signal is secondary ions generated in response to the beams being incident upon the fiducial grid.

31. The method as claimed in claim 17, wherein the signal is fluorescence light generated in response to the beams being incident upon the fiducial grid.

32. The method as claimed in claim 17, wherein the signal is light generated in response to the beams being incident upon the fiducial grid.

33. The method as claimed in claim 17, wherein the signal is backscattered electrons generated in response to the beams being incident upon the fiducial grid.

34. A maskless lithography system, comprising:
a substrate to be processed, said substrate including a fiducial grid with a single spatial-period, said fiducial grid being rotated at an angle with respect to a direction of scanning a beam;
a beam source to generate a beam to scan said substrate;
a deflection system to two-dimensionally deflect a position of said beam with respect to said substrate;
a detector to detect a signal generated in response to said beam being incident upon said fiducial grid; and
a processor to determine a plurality of frequency components of the detected signal and determine a two-dimensional location of the beam from phases of two determined frequency components of the detected signal.

35. The system as claimed in claim 34, wherein said processor determines a size of said beam from relative amplitudes of determined frequency components of the detected signal corresponding to fundamental and harmonic frequency components of the detected signal.

36. The system as claimed in claim 34, wherein said processor determines a shape of said beam from relative amplitudes of determined frequency components of the detected signal corresponding to fundamental and harmonic frequency components of the detected signal.

37. The system as claimed in claim 34, wherein said processor determines a size of said beam from relative amplitudes of determined frequency components of the detected signal corresponding to fundamental and harmonic frequency components of the detected signal and determines a shape of the beam from relative amplitudes of determined frequency components of the detected signal corresponding to fundamental and harmonic frequency components of the detected signal.

38. The system as claimed in claim 34, wherein said deflection system correcting a deflection of said beam in response to the determined two-dimensional location.

39. The system as claimed in claim 35, wherein said deflection system corrects a deflection of the beam in response to the determined two-dimensional location and adjusts the size of the beam in response to the determined size.

40. The system as claimed in claim 36, wherein said deflection system corrects a deflection of the beam in response to the determined two-dimensional location and adjusts the shape of the beam in response to the determined shape.

41. The system as claimed in claim 37, wherein said deflection system corrects a deflection of the beam in response to the determined two-dimensional location;
adjusts the size of the beam in response to the determined size; and adjusts the shape of the beam in response to the determined shape.

42. The system as claimed in claim 34, wherein said beam is an electron beam.

43. The system as claimed in claim 34, wherein said beam is a particle beam.

44. The system as claimed in claim 34, wherein said beam is a photon beam.

45. The system as claimed in claim 34, wherein said signal is secondary electrons generated in response to said beam being incident upon said fiducial grid.

46. The system as claimed in claim 34, wherein said signal is secondary ions generated in response to said beam being incident upon said fiducial grid.

47. The system as claimed in claim 34, wherein said signal is fluorescence light generated in response to said beam being incident upon said fiducial grid.

48. The system as claimed in claim 34, wherein said signal is light generated in response to said beam being incident upon said fiducial grid.

49. The system as claimed in claim 34, wherein said signal is backscattered electrons generated in response to said beam being incident upon said fiducial grid.

50. A maskless lithography system, comprising:
    a substrate to be processed, said substrate including a fiducial grid with a varying spatial-period;
    a beam source to generate a plurality of beams to scan said substrate;
    a deflection system to independently two-dimensionally deflect a position of each beam with respect to said substrate;
    a detector to detect a signal generated in response to each beam being incident upon said fiducial grid; and
    a processor to determine frequency components, for each beam, of the detected signals and determine a two-dimensional location, for each beam, from beam associated phases of two determined frequency components of the beam associated detected signal.

51. The system as claimed in claim 50, wherein said processor determines a size of each beam from relative amplitudes of determined frequency components of the detected signal corresponding to fundamental and harmonic frequency components of the detected signal.

52. The system as claimed in claim 50, wherein said processor determines a shape of each beam from the relative amplitudes of determined frequency components of the detected signal corresponding to fundamental and harmonic frequency components of the detected signal.

53. The system as claimed in claim 50, wherein said processor determines a size of each beam from relative amplitudes of determined frequency components of the detected signal corresponding to fundamental and harmonic frequency components of the detected signal and determines a shape of each beam from the relative amplitudes of determined frequency components of the detected signal corresponding to fundamental and harmonic frequency components of the detected signal.

54. The system as claimed in claim 50, wherein said deflection system corrects a deflection of each beam in response to the determined two-dimensional location.

55. The system as claimed in claim 50, wherein said processor determines frequency components for each beam using frequency-division multiplexing.

56. The system as claimed in claim 51, wherein said deflection system correcting a deflection of each beam in response to the determined two-dimensional location.

57. The system as claimed in claim 52, wherein said deflection system corrects a deflection of each beam in response to the determined two-dimensional location and adjusts the size of the beam in response to the determined size.

58. The system as claimed in claim 53, wherein said deflection system corrects a deflection of each beam in response to the determined two-dimensional location; adjusts the size of the beam in response to the determined size; and adjusts the shape of the beam in response to the determined shape.

59. The system as claimed in claim 54, wherein said deflection system corrects a deflection of each beam in response to the determined two-dimensional location; adjusts the size of the beam in response to the determined size; and adjusts the shape of the beam in response to the determined shape.

60. The system as claimed in claim 50, wherein said plurality of beams are electron beams.

61. The system as claimed in claim 50, wherein said plurality of beams are particle beams.

62. The system as claimed in claim 50, wherein said plurality of beams are photon beams.

63. The system as claimed in claim 50, wherein said signal is secondary electrons generated in response to said beams being incident upon said fiducial grid.

64. The system as claimed in claim 50, wherein said signal is secondary ions generated in response to said beams being incident upon said fiducial grid.

65. The system as claimed in claim 50, wherein said signal is fluorescence light generated in response to said beams being incident upon said fiducial grid.

66. The system as claimed in claim 50, wherein said signal is light generated in response to said beams being incident upon said fiducial grid.

67. The system as claimed in claim 50, wherein said signal is backscattered electrons generated in response to said beams being incident upon said fiducial grid.

* * * * *